(12) United States Patent
Jiang et al.

(10) Patent No.: US 12,484,359 B2
(45) Date of Patent: Nov. 25, 2025

(54) STRETCHABLE DISPLAY PANEL

(71) Applicant: AUO Corporation, Hsin-Chu (TW)

(72) Inventors: Cheng-Wei Jiang, Hsin-Chu (TW); Yi-Da He, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 429 days.

(21) Appl. No.: 18/090,115

(22) Filed: Dec. 28, 2022

(65) Prior Publication Data

US 2023/0216010 A1 Jul. 6, 2023

(30) Foreign Application Priority Data

Jan. 6, 2022 (TW) .................................. 111100626

(51) Int. Cl.
*H01L 27/15* (2006.01)
*H01L 25/075* (2006.01)
(Continued)

(52) U.S. Cl.
CPC ....... *H10H 20/857* (2025.01); *H01L 25/0753* (2013.01)

(58) Field of Classification Search
CPC ...... H10K 77/10–111; H10K 2102/311; G09G 2380/02
See application file for complete search history.

(56) References Cited

U.S. PATENT DOCUMENTS

2013/0249877 A1* 9/2013 Choi ...................... H10D 86/60
                                                        345/205
2019/0280077 A1* 9/2019 Park ...................... H10K 77/111
(Continued)

FOREIGN PATENT DOCUMENTS

CN       108091612 A     5/2018
CN       112563433 A     3/2021
(Continued)

OTHER PUBLICATIONS

Office Action issued by the State Intellectual Property Office of the Peoples Republic of China on May 28, 2023 for Application No. 202210518001.X, China.
(Continued)

*Primary Examiner* — Ismail A Muse
(74) *Attorney, Agent, or Firm* — Tim Tingkang Xia, Esq.; Troutman Pepper Locke LLP

(57) ABSTRACT

A stretchable display panel includes a substrate, a plurality of circuit structures, a plurality of light-emitting components, a plurality of signal lines, a laser absorbing layer and a stretchable filling material. The substrate has a plurality of island sections and a plurality of bridge sections. The island sections are connected to the bridge sections, and both the island sections and the bridge sections define the openings of the substrate. The circuit structures are disposed on the island sections. The light-emitting components are disposed on the circuit structures. The signal lines are disposed on the bridge sections, and the signal lines are electrically connected to the circuit structures. The laser absorbing layer is disposed in at least the openings. The stretchable filling material is disposed above the substrate, where the stretchable filling material covers at least both the laser absorbing layer and the light-emitting components.

15 Claims, 8 Drawing Sheets

(51) Int. Cl.
    *H01L 29/26*     (2006.01)
    *H01L 31/12*     (2006.01)
    *H01L 33/00*     (2010.01)
    *H10H 20/857*     (2025.01)

(56) References Cited

U.S. PATENT DOCUMENTS

| | | | |
|---|---|---|---|
| 2021/0193779 A1* | 6/2021 | Lee | H10K 59/131 |
| 2023/0209164 A1* | 6/2023 | Ye | H04M 1/0264 |
| | | | 348/374 |

FOREIGN PATENT DOCUMENTS

| | | |
|---|---|---|
| CN | 113270036 A | 8/2021 |
| WO | 2022017026 A1 | 1/2022 |

OTHER PUBLICATIONS

Office Action issued by (TIPO) Intellectual Property Office Ministry of Economic Affairs R.O.C. on Oct. 19, 2022 for Application No. 111100626, Taiwan.

\* cited by examiner

STRETCHABLE DISPLAY PANEL

CROSS-REFERENCE TO RELATED PATENT APPLICATION

This non-provisional application claims priority to and the benefit of, pursuant to 35 U.S.C. § 119(a), patent application Serial No. 111100626 filed in Taiwan on Jan. 6, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display panel, and particularly to a stretchable display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, display technology has developed a stretchable display panel, which has sufficient elasticity, stretchability and flexibility and is conducive to stretching and bending, thus being suited to applications in electronic devices such as smart wearable devices, etc. Generally, an existing stretchable display panel is firstly manufactured on a glass plate. Then, the stretchable display panel and the glass plate are separated by laser lift-off (LLO).

Currently, the stretchable display panel mostly includes a flexible substrate and an overcoat covering the flexible substrate. Prior to performing the LLO, both the flexible substrate and the overcoat are in contact with and connected to the glass plate. In the process of performing the LLO, the laser beam penetrates the glass plate and emits on the flexible substrate and the overcoat to separate the stretchable display panel and the glass plate.

Generally, the flexible substrate has a very low transmittance for the laser beam, so the flexible substrate may absorb most of the laser beam to separate the stretchable display panel and the glass plate. However, the overcoat has a transmittance for the laser beam on the high side, so the absorbing of the laser beam by the overcoat is quite limited, and after the emission of the laser beam, the overcoat is not easily separated from the glass plate. Thus, in the process of separating the stretchable display panel and the glass plate, the overcoat may easily adhere to the glass plate, causing the stretchable display panel to damage due to being pulled, and resulting in difficulties to increase the yield thereof.

SUMMARY

At least one embodiment of the present disclosure provides a stretchable display panel, which includes a laser absorbing layer to help the stretchable display panel and the glass to separate smoothly.

In at least one embodiment of the present disclosure, the stretchable display panel includes a substrate, a plurality of circuit structures, a plurality of light-emitting components, a plurality of signal lines, a laser absorbing layer and a stretchable filling material. The substrate has a plurality of island sections and a plurality of bridge sections, where the island sections are connected to the bridge sections, and the island sections and the bridge sections define a plurality of openings of the substrate. The circuit structures are disposed on the island sections. The light-emitting components are disposed on the circuit structures. The signal lines are disposed on the bridge sections, and the signal lines are electrically connected to the circuit structures. The laser absorbing layer is disposed in at least the openings. The stretchable filling material is disposed above the substrate, where the stretchable filling material covers at least both the laser absorbing layer and the light-emitting components.

In at least one embodiment of the present disclosure, the laser absorbing layer is further disposed on the circuit structures and on the signal lines, and covers a side wall of each of the circuit structures and the signal lines.

In at least one embodiment of the present disclosure, each of the circuit structures includes a plurality of insulating layers stacked with each other, a plurality of conductive pattern layers and a plurality of conductive connecting portions. The conductive pattern layers are electrically connected to the light-emitting components and the signal lines, and each of the conductive pattern layers is located between two adjacent ones of the insulating layers. The plurality of conductive connecting portions are located in the insulating layers, and are connected between two adjacent ones of the conductive pattern layers.

In at least one embodiment of the present disclosure, the circuit structures include a plurality of transistor components, and the transistor components are electrically connected to the light-emitting components.

In at least one embodiment of the present disclosure, the stretchable display panel further includes a plurality of conductive members. The conductive members are disposed between the light-emitting components and the circuit structures, and are electrically connected to the light-emitting components and the circuit structures.

In at least one embodiment of the present disclosure, a material of at least one of the conductive members is indium (In).

In at least one embodiment of the present disclosure, a transmittance of the laser absorbing layer for light with a wavelength less than or equal to 400 nm is less than or equal to 10%.

In at least one embodiment of the present disclosure, a color of the laser absorbing layer is black.

In at least one embodiment of the present disclosure, the laser absorbing layer is an organic insulating layer or an inorganic insulating layer.

In at least one embodiment of the present disclosure, the laser absorbing layer comprises at least one of an amorphous silicon layer, a silicon oxide layer and a silicon nitride layer.

Based on the foregoing, the laser absorbing layer may absorb the laser beam and be gasified or ablated by the laser beam. Thus, in the process of performing the LLO, the laser absorbing layer may help the stretchable display panel and the glass to separate smoothly, thus reducing or avoiding from the case where the stretchable display panel is damaged after performing the LLO, and thereby increasing the yield of the stretchable display panel.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

In the contents described below, in order to clearly present the technical features of the present disclosure, the sizes (such as lengths, widths, thicknesses and depths) of the components (such as layers, films, substrates and regions, etc.) as shown in the figures may be enlarged in an unequal proportional manner, and the quantities of some of the components may be reduced. Thus, the description and explanation of the exemplary embodiments as described below are not limited to the component quantities and the sizes and shapes of the components as shown in the figures, and deviations of the sizes, shapes and both serving as a result of manufacturing techniques and/or tolerances may be expected. For example, a flat surface shown in the figures may generally have rough and/or non-linear features, and an acute angle shown in the figures may be round. Therefore, the components as shown in the figures are essentially schematic, and shapes thereof are not intended to show the accurate shapes of the components, and are not intended to limit the scope of the claims of the present disclosure.

The terms "about", "approximately" or "substantially" as used herein shall cover the values and value ranges described, and cover an acceptable deviation range of the specific values ascertained by one of ordinary skill in the art, where the deviation range may be determined by specific quantities of errors related to the measurement, and the errors are determined by the limitations of the measuring system or the manufacturing process conditions. In addition, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristic, the mechanical characteristics or other characteristics, without applying one standard deviation to all characteristics such as the optical characteristics, the etching characteristic, the mechanical characteristics or other characteristics.

Figure 1A:
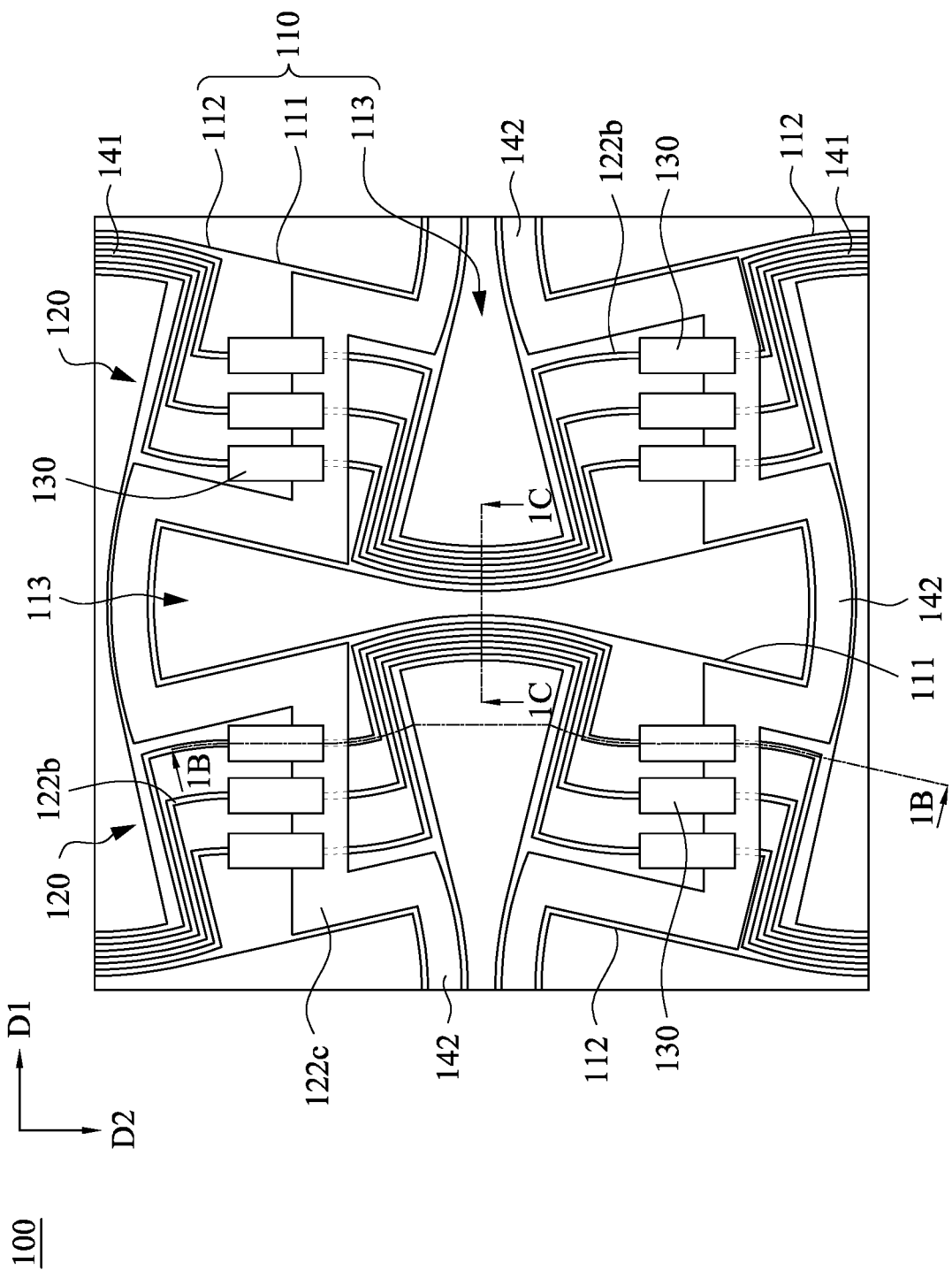
FIG. 1A is a partial top schematic view of a stretchable display panel according to at least one embodiment of the present disclosure.

FIG. 1A is a partial top schematic view of a stretchable display panel according to at least one embodiment of the present disclosure. Referring to FIG. 1A, the stretchable display panel 100 includes a substrate 110, which has good elasticity, stretchability and flexibility, such that the substrate 110 may be stretched or bent. The substrate 110 may be formed by a polymer material with elasticity and flexibility, where the polymer material may be, for example, polyimide (PI) or polyethylene terephthalate (PET). As illustrated in FIG. 1A, the stretchable display panel 100 is not stretched or bent.

The substrate 110 has a plurality of island sections 111 and a plurality of bridge sections 112, and the island sections 111 are connected to the bridge sections 112. The island sections 111 may be arranged in a matrix. For example, the island sections 111 may be arranged along a first direction D1 to form a plurality of rows, and arranged along a second direction D2 to form a plurality of columns, where the first direction D1 and the second direction D2 are perpendicular to each other. Using FIG. 1A as an example, the first direction D1 may be a horizontal direction, and the second direction D2 may be a vertical direction. The shapes of most of the island sections 111 may be approximately rectangular. For example, at least one of the island sections 111 has four edges, and the bridge sections 112 (for example, four bridge sections 112) are respectively connected to the four edges of the same island section 111.

The island sections 111 and the bridge sections 112 may be integrally formed into one. For example, the substrate 110 may be formed by patterning a polymer substrate, and the polymer substrate may be formed by the polymer material with elasticity and flexibility, such as PI or PET. Thus, the island section 111 and the bridge section 112 adjacent to each other may be directly connected, and there is no seam existing between the island section 111 and the bridge section 112 being connected to each other.

In the embodiment as shown in FIG. 1A, the extending directions of the bridge sections 112 may be different, where some of the bridge sections 112 may extend along the first direction D1, and other bridge sections 112 may extend along the second direction D2. In the stretchable display panel 100 not being stretched and not being bent, each bridge section 112 extends substantially along a curve or an arc, and the shape of the edge of each bridge section 112 may be a curve or an arc. As shown in FIG. 1A, when the stretchable display panel 100 is stretched, at least one of the bridge sections 112 is stretched, such that the bridge section 112 being stretched extends along a straight line. That is, the shape of the edge of the bridge section 112 being stretch may be a straight line.

The island sections 111 and the bridge sections 112 define a plurality of openings 113 of the substrate 110, where each opening 113 is surrounded by a plurality of island sections 111 and a plurality of bridge sections 112. When the stretchable display panel 100 is not stretched and not bent, the openings 113 are strip-shaped, and for most of the openings 113, the widths at two ends of each opening 113 is greater than the width at the middle of each opening 113. For example, the opening 113 located at the middle of FIG. 1A is approximately dumbbell-shaped.

The extending directions of the openings 113 may also be different. In the embodiment as shown in FIG. 1A, some of the openings 113 extend along the first direction D1, and other openings 113 112 extend along the second direction D2. Further, the openings 113 may be arranged alternately according to different extending directions, such that two adjacent openings 113 respectively have extending directions different from each other.

Figure 1B:
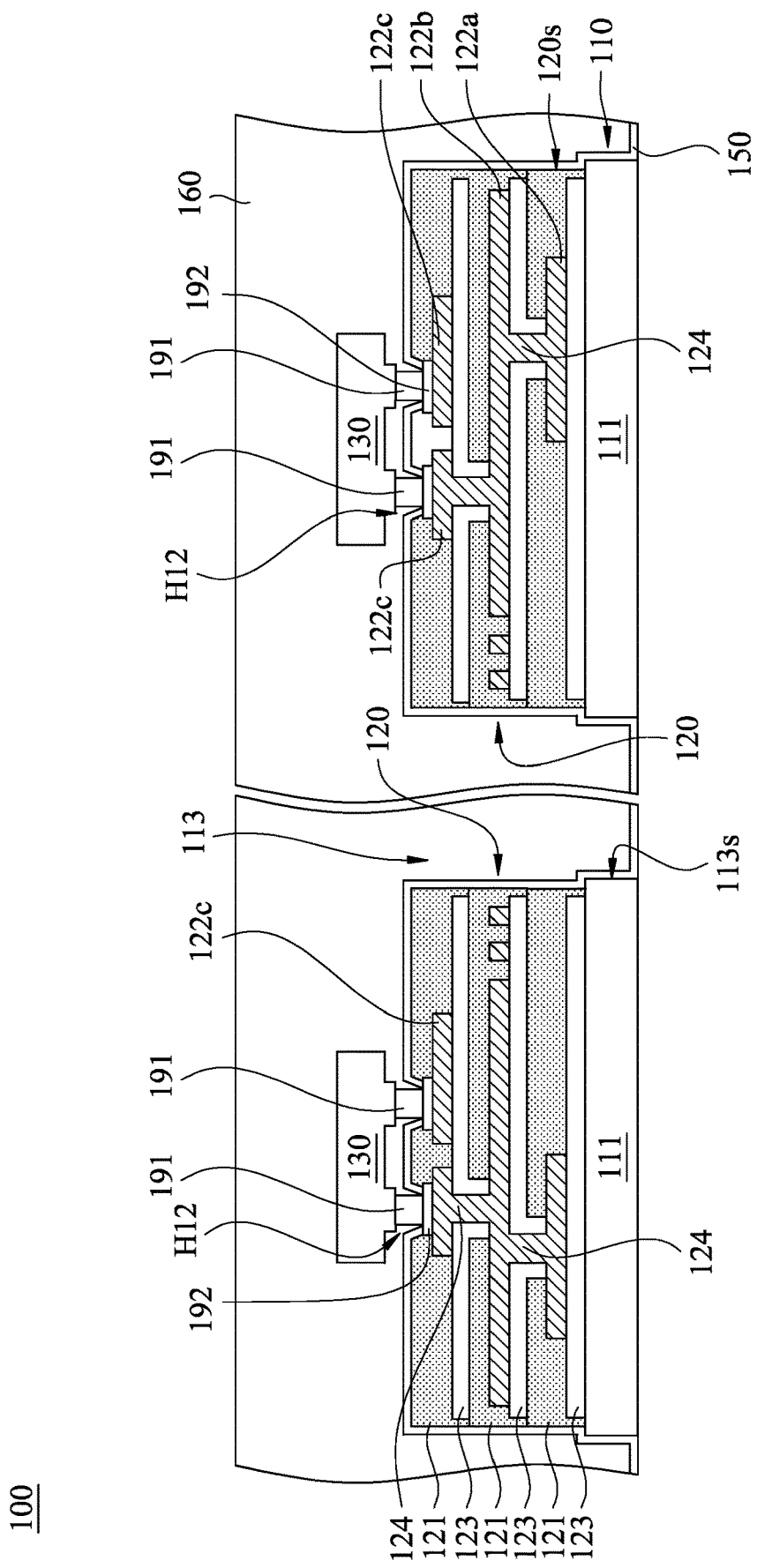
FIG. 1B is a sectional schematic view of FIG. 1A along a line 1B-1B.

FIG. 1B is a sectional schematic view of FIG. 1A along a line 1B-1B. Referring to FIG. 1A and FIG. 1B, the stretchable display panel 100 further includes a plurality of circuit structures 120, a plurality of light-emitting components 130 and a plurality of signal lines 141, 142. The circuit structures 120 are disposed on the island sections 111. The signal lines 141 and 142 are disposed on the bridge sections 112, and are electrically connected to the circuit structures 120.

The signal lines 141 and 142 are respectively disposed on the bridge sections 112. Using FIG. 1A as an example, the signal lines 141 (such as three signal lines 141) may be disposed on one of the bridge sections 112 extending along the second direction D2, and a signal line 142 may be disposed on one of the bridge sections 112 extending along the first direction D1. Thus, basically, the signal lines 142 extend along the first direction D1, and the signal lines 141 extend along the second direction D2. In other words, the signal lines 141 and 142 have different extending directions.

The light-emitting components 130 are disposed on the circuit structures 120, and are located on the island sections 111. The light-emitting components 130 are electrically connected to the circuit structures 120. The light-emitting components 130 may be organic light emitting diodes (OLEDs) or light emitting diodes (LEDs), such as micro LEDs (μLEDs) or mini LEDs.

The light-emitting components 130 may be disposed on one circuit structure 120. Using FIG. 1A as an example, three light-emitting components 130 are disposed on the same circuit structure 120, and the three light-emitting components 130 may be respectively a red LED, a green LED and a blue LED to emit light with different colors, such as red light, green light and blue light. Thus, the light-emitting components 130 disposed on the single circuit structure 120 may function as a main pixel of the stretchable display panel 100, and by utilizing the light with different colors emitted by the light-emitting components 130 (such as red light, green light and blue light), the stretchable display panel 100 may display images.

However, it should be noted that, in other embodiments, the light-emitting components 130 may emit light with the same color, such as white light or blue light, and the stretchable display panel 100 may include a plurality of wavelength transforming materials (not shown), such as light filtering layers, fluorescent materials or quantum dot materials. The wavelength transforming materials may transform light emitted by the light-emitting components 130 (such as white light or blue light) to light with different colors, such as red light, green light and blue light, such that the stretchable display panel 100 may display images.

The circuit structures 120 may include a plurality of insulating layers 121, 123 stacked with each other, and a plurality of conductive pattern layers 122a, 122b and 122c. The conductive pattern layer 122b is located between the conductive pattern layers 122a and 122c, so the conductive pattern layers 122a, 122b and 122c are not coplanar to one another. Each of the conductive pattern layers 122a, 122b and 122c is located between two adjacent layers of the insulating layers 121 and 123. Using FIG. 1B as an example, each insulating layer 123 is adjacent to at least one layer of the insulating layers 121, and the insulating layers 121 and 123 are stacked alternately. Each of the conductive pattern layers 122a, 122b and 122c is sandwiched between the insulating layers 121 and 123 adjacent to each other.

The insulating layers 121 and 123 may be formed by different materials. The insulating layers 121 may be organic material layers, and the insulating layers 123 may be inorganic material layers. The insulating layers 123 may be formed by silicon oxide or silicon nitride. In addition, it should be noted that, FIG. 1A is illustrated by omitting the insulating layers 121, 123 and the conductive pattern layer 122a, such that FIG. 1A may clearly illustrate the conductive pattern layers 122b and 122c.

The conductive pattern layers 122a, 122b and 122c are electrically connected to the signal lines 141, 142. In this embodiment, the conductive pattern layer 122c is connected to the signal lines 142, and the conductive pattern layer 122b is connected to the signal lines 141. The conductive pattern layer 122c and the signal lines 142 may be formed by a same metal layer through photolithography, so the conductive pattern layer 122c and the signal lines 142 may be coplanar to each other and formed on the surface of the same layer of the insulating layers 123, and the conductive pattern layer 122c and the signal lines 142 connected to each other may be integrally formed.

Similarly, the conductive pattern layer 122b and the signal lines 141 may also be formed by a same metal layer through photolithography, so the conductive pattern layer 122b and the signal lines 141 may be coplanar to each other and formed on the surface of another layer of the insulating layers 123, and the conductive pattern layer 122b and the signal lines 141 connected to each other may be integrally formed.

Since the conductive pattern layer 122c and the signal lines 142 connected to each other may be integrally formed, and the conductive pattern layer 122b and the signal lines 141 connected to each other may be integrally formed, a portion of the conductive pattern layer 122b located on the island sections 111 may be substantially a portion of the signal lines 141, and a portion of the conductive pattern layer 122c located on the island sections 111 may be substantially a portion of the signal lines 142. In other words, the signal lines 141 and 142 may substantially extend from the bridge sections 112 to be above the island sections 111, thereby passing the island sections 111.

In each circuit structure 120, the uppermost layer of the insulating layers 121 covers the conductive pattern layer 122c, and has a plurality of contact holes H12 not covering the conductive pattern layer 122c, such that the conductive pattern layer 122c may be electrically connected to the light-emitting components 130. Using FIG. 1B as an example, the stretchable display panel 100 may further include a plurality of conductive members 191. The conductive members 191 are disposed between the light-emitting components 130 and the circuit structures 120, and are respectively located in the contact holes H12. The conductive members 191 may be electrically connected to the light-emitting components 130 and the circuit structures 120 through the contact holes H12.

In this embodiment, a material of at least one of the conductive members 191 may be indium (In). For example, each conductive member 191 may be an indium granular with high purity. Since the indium granular is soft, the indium granular may be squeezed on the conductive pattern layer 122c, such that the indium granular may be attached to the conductive pattern layer 122c. Thus, the light-emitting components 130 may be fixed to the conductive pattern layer 122c through the conductive members 191, and the conductive members 191 are electrically connected to the light-emitting components 130. In addition, the conductive members 191 may be solders, so the light-emitting components 130 may be electrically connected to the conductive pattern layer 122c through soldering, and the material of the conductive member 191 is not limited to being indium.

It should be noted that, the stretchable display panel 100 as shown in FIG. 1B may further include a plurality of connecting layers 192. The connecting layers 192 are disposed on the conductive pattern layer 122c, and are respectively located at the bottom portions of the contact holes H12. Thus, the uppermost layer of the insulating layers 121 does not completely cover the connecting layers 192. The conductive members 191 are disposed on the connecting layers 192, and the connecting layers 192 are located between the conductive pattern layer 122c and the conductive members 191. The connecting layers 192 may be formed by a conductive material, and the conductive material may be a metal or a metal oxide. For example, the connecting layers 192 may be formed by indium tin oxide (ITO). Thus, the conductive pattern layer 122c may be electrically connected to the light-emitting components 130 through the connecting layers 192 and the conductive members 191.

The stretchable display panel 100 may further include a plurality of conductive connecting portions 124. The conductive connecting portions 124 are located in the insulating layers 121 and 123, and are connected between two adjacent layers of the conductive pattern layers 122a, 122b and 122c. Therefore, the conductive pattern layers 122a, 122b and 122c in a same circuit structure 120 may be electrically connected through the conductive connecting portions 124, such that the conductive pattern layers 122a and 122b may be electrically connected to the light-emitting components 130. In addition, in the embodiment as shown in FIG. 1B, the shape of each conductive connecting portion 124 may be a cylinder.

In the embodiment as shown in FIG. 1B, the stretchable display panel 100 may be a passive display panel, and the circuit structures 120 are electrically connected to at least one outside driving device (not illustrated), which may have a driver integrated circuit (driver IC). Since the conductive pattern layers 122a, 122b and 122c may be electrically connected through the conductive connecting portions 124, and may all be electrically connected to the light-emitting components 130, the outside driving device may drive and control the light-emitting components 130 through the conductive pattern layers 122a, 122b and 122c, such that the outside driving device drives and controls the light-emitting components 130 to emit light through the circuit structures 120, thereby allowing the stretchable display panel 100 to display images.

The stretchable display panel 100 further includes a laser absorbing layer 150, and the laser absorbing layer 150 is disposed in at least the openings 113. In the embodiment as shown in FIG. 1B, the laser absorbing layer 150 is further disposed on the circuit structures 120, and may completely cover the substrate 110 and the circuit structures 120, so the laser absorbing layer 150 covers a side wall 120s of each of the circuit structures 120 and a side wall 113s of each of the openings 113 (which equal to the side wall of the substrate 110). It should be noted that FIG. 1A is drawn under the condition that the laser absorbing layer 150 is omitted, so the laser absorbing layer 150 is not illustrated in FIG. 1A.

The laser absorbing layer 150 may be an insulating layer and has a plurality of openings (not shown), and the openings are respectively communicated to the contact holes H12. In other words, the laser absorbing layer 150 does not completely cover the conductive pattern layer 122c and the connecting layers 192, such that the conductive pattern layer 122c may be electrically connected to the light-emitting component 130. Further, the laser absorbing layer 150 may be an organic insulating layer, an inorganic insulating layer or a semiconductor layer, and the semiconductor layer may be undoped. For example, the material of the laser absorbing layer 150 may include one of an amorphous silicon layer, a silicon oxide layer and a silicon nitride layer.

The stretchable display panel 100 further includes a stretchable filling material 160, which is disposed above the substrate 110, and the stretchable filling material 160 covers at least the laser absorbing layer 150 and the light-emitting components 130. For example, in the embodiment as shown in FIG. 1B, the stretchable filling material 160 may completely cover the substrate 110, the laser absorbing layer 150, the light-emitting components 130 and the circuit structures 120, and the stretchable filling material 160 may further fill the openings 113. Thus, the stretchable filling material 160 also covers the side wall 120s of each of the circuit structures 120 and the side wall 113s of each of the openings 113 (which equal to the side wall of the substrate 110).

Since the stretchable filling material 160 may completely cover the substrate 110, the laser absorbing layer 150, the light-emitting components 130 and the circuit structures 120, the stretchable filling material 160 may protect the light-emitting components 130 and the circuit structures 120 from being collided by outer objects. In other words, the stretchable filling material 160 also serves as a protective layer of the stretchable display panel 100.

The stretchable filling material 160 also has good elasticity, stretchability and flexibility, so the stretchable filling material 160 may be stretched or bent, similar to the substrate. Thus, the stretchable filling material 160 may match the stretching and bending of the substrate 110, that is, the stretchable filling material 160 basically does not affect the stretching and bending of the substrate 110. Further, the stretchable filling material 160 may include one of acrylate, epoxy, polyurethane (PU), silicone and rubber. That is, the stretchable filling material 160 may be any combination of the aforementioned materials and other materials.

Figure 1C:
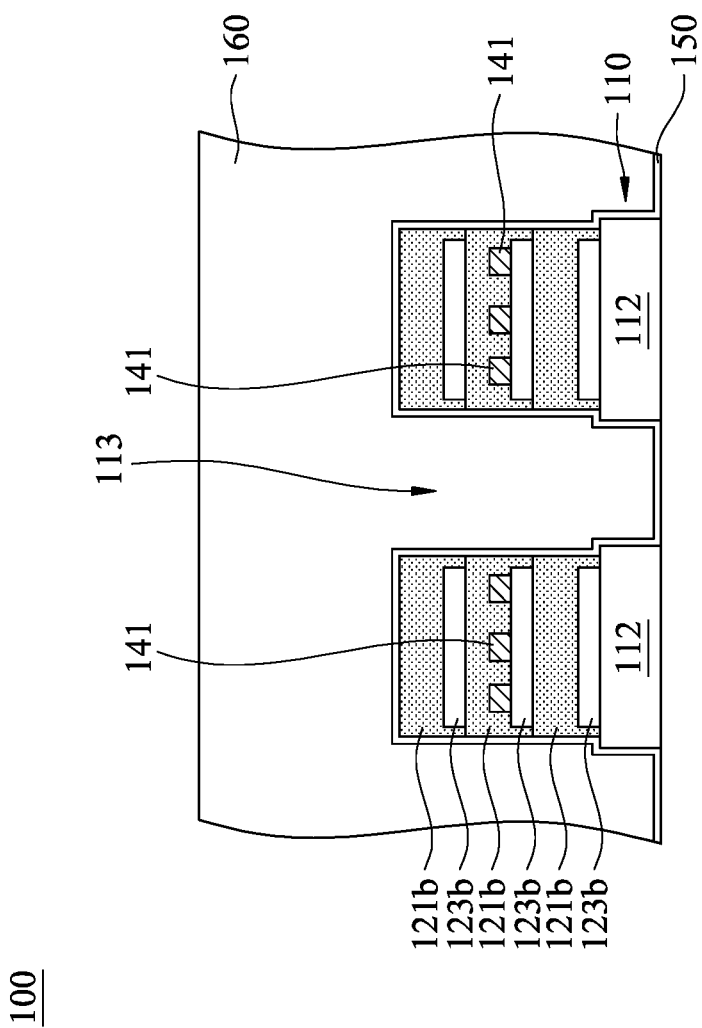
FIG. 1C is a sectional schematic view of FIG. 1A along a line 1C-1C.

FIG. 1C is a sectional schematic view of FIG. 1A along a line 1C-1C. Referring to FIG. 1A to FIG. 1C, the stretchable display panel 100 may further include a plurality of insulating layers 121b and 123b stacked with each other, and the insulating layers 121b and 123b are respectively disposed on the bridge sections 112. Each insulating layer 123b is adjacent to at least one layer of the insulating layers 121b, and the insulating layers 121b and 123b are alternately stacked. Further, FIG. 1A is drawn under the condition that the insulating layers 121b and 123b are omitted, such that FIG. 1A clearly shows the signal lines 141 and 142.

The bridge sections 112 as shown in FIG. 1C extend along the second direction D2. Since the signal lines 141 are disposed in the bridge sections 112 extending along the second direction D2, FIG. 1C illustrates a plurality of signal lines 141. The signal lines 141 may be located between two adjacent layers of the insulating layers 121b and 123b. Using FIG. 1C as an example, the signal lines 141 may be located between the adjacent insulating layers 121b and 123b in the middle, and may be connected to the conductive pattern layer 122b. The materials of the insulating layers 121b and 123b are different, where the insulating layer 121b may be an organic material layer, and the insulating layer 123b may be an inorganic material layer, which may be formed by, for example, silicon oxide or silicon nitride.

The insulating layers 121b are respectively connected to the insulating layers 121, and the insulating layers 123b are respectively connected to the insulating layers 123. In the present embodiment, the insulating layers 121 and 121b connected together may be manufactured by a same insulating layer (such as an organic insulating layer), so the insulating layers 121 and 121b connected together may be integrally formed. Similarly, the insulating layers 123 and 123b connected together may be manufactured by a same insulating layer (such as an inorganic insulating layer), so the insulating layers 123 and 123b connected together may be integrally formed. Thus, the insulating layers 121b may be viewed as portions of the insulating layers 121 extending to the bridge sections 112, and the insulating layers 123b may be viewed as portions of the insulating layers 123 extending to the bridge sections 112.

The insulating layers 121b and 123b are also disposed on the bridge sections 112 extending along the first direction D1, and the signal lines 142 may be located between two adjacent layers of the insulating layers 121b and 123b. For example, the signal lines 142 may be located between the adjacent insulating layers 121b and 123b above, and may be connected to the conductive pattern layer 122c.

Further, in other embodiments, the signal lines 141 and 142 may be disposed at other locations. For example, the signal lines 142 may be disposed between the adjacent insulating layers 121b and 123b below, and the signal lines 141 may be disposed between the adjacent insulating layers 121b and 123b above. Thus, the signal lines 141 and 142 may be disposed between any two adjacent layers of the insulating layers 121b and 123b.

It should be noted that each of the signal lines 141 and 142 may be formed by a single metal layer through photolithography, so each of the signal lines 141 and 142 may be basically a single film layer located on one of the insulating layers 123b. However, at least one of the signal lines 141 and 142 may be formed on at least two insulating layers 123b.

Specifically, at least one of the signal lines 141 and 142 may include a plurality of layers of film layers not coplanar and a plurality of conductive connecting portions connecting the film layers. At least two of the film layers may overlap, and each of the conductive connecting portions passes through at least one insulating layer 121b and at least one insulating layer 123b. The structure and shape of the conductive connecting portions may be identical or similar to those of the conductive connecting portions 124. Thus, the signal lines 141 or 142 may include a plurality of layers of film layers not coplanar, without being limited to a single film layer.

The laser absorbing layer 150 is further disposed on the signal lines 141 and 142 and covers the signal lines 141 and 142, and the laser absorbing layer 150 further covers the insulating layers 121b and 123b. For example, the laser absorbing layer 150 further covers top surfaces and side walls of the insulating layers 121b and 123b and the side walls of the bridge sections 112, as shown in FIG. 1C. Thus, the laser absorbing layer 150 may completely cover the insulating layers 121b and 123b.

Figure 2A:
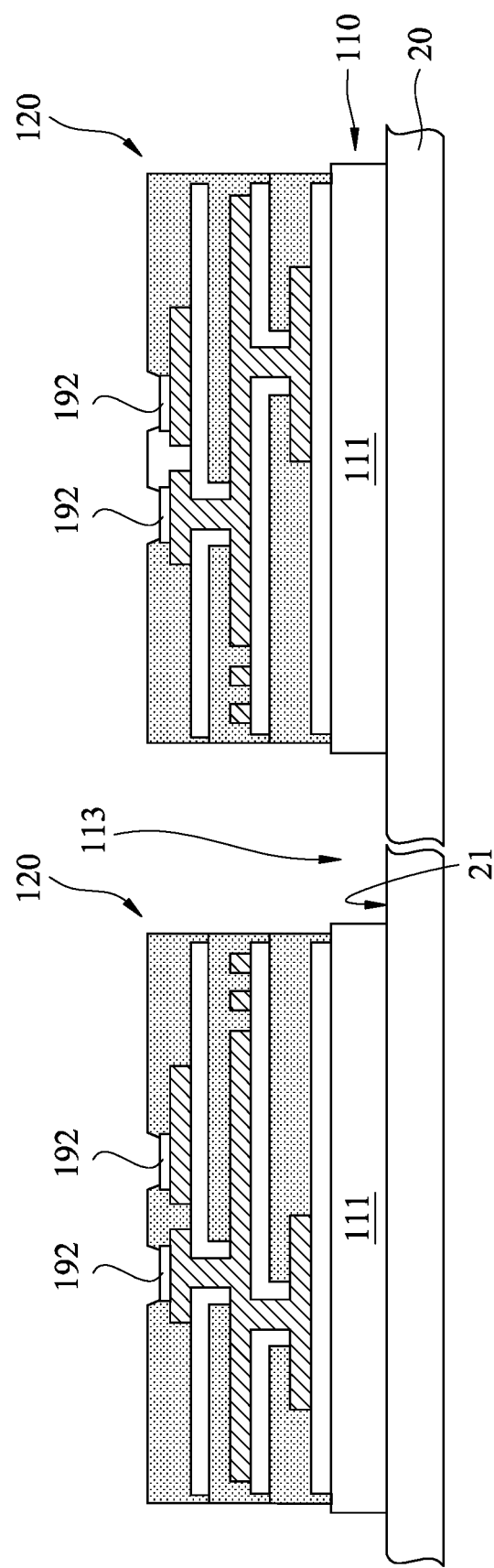
FIGS. 2A to 2D are sectional schematic views of a manufacturing process of the stretchable display panel as shown in FIG. 1B.

FIGS. 2A to 2D are sectional schematic views of a manufacturing process of the stretchable display panel as shown in FIG. 1B. Referring to FIG. 2A, firstly, the substrate 110 and the circuit structures 120 are formed on a supporting plate 20, where the connecting layers 192 have been disposed on the circuit structures 120. The substrate 110 is adhered to the supporting plate 20 and is in direct connect with the supporting plate 20, and the openings 113 provided by the substrate 110 partially expose an upper surface 21 of the supporting plate 20.

The substrate 110 may be formed by patterning a polymer substrate with elasticity and flexibility, where the patterning method of the polymer substrate may be photolithography, and prior to performing patterning of the polymer substrate, the circuit structures 120 and the polymer substrate have been disposed on the supporting plate 20. Further, the supporting plate 20 may be a transparent rigid plate, such as a glass plate.

Figure 2B:
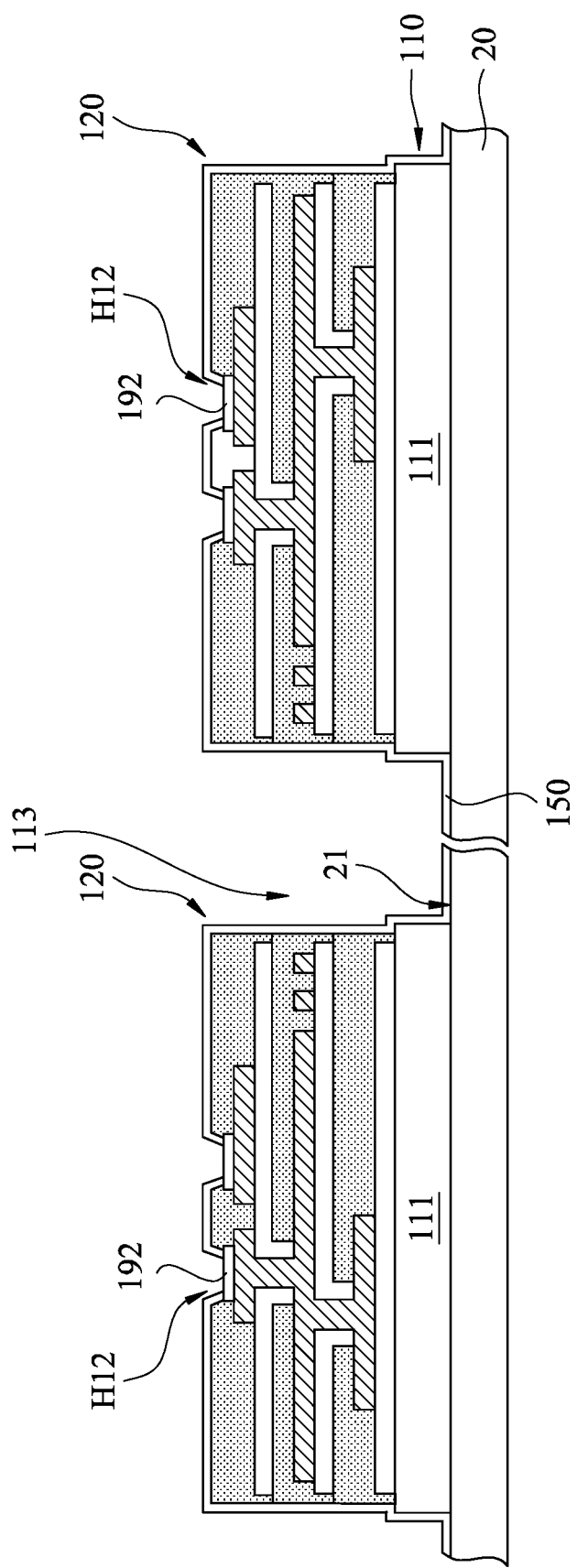

Referring to FIG. 2B, then, the laser absorbing layer 150 is formed on the circuit structures 120, the substrate 110 and the supporting plate 20. The laser absorbing layer 150 covers the circuit structures 120, the substrate 110 and the supporting plate 20, and may completely cover the circuit structures 120. The laser absorbing layer 150 covers the upper surface 21 of the supporting plate 20 located in the openings 113, such that the upper surface 21 is completely covered by the laser absorbing layer 150 and the substrate 110.

When the laser absorbing layer 150 is an inorganic insulating layer or a semiconductor layer, the laser absorbing layer 150 may be formed by chemical vapor deposition (CVD) or physical vapor deposition (PVD). After performing the CVD or PVD, the laser absorbing layer 150 is formed to cover the connecting layers 192. Then, the portion of the laser absorbing layer 150 covering the connecting layers 192 is removed to expose the connecting layers 192, where the removing method of the portion of the laser absorbing layer 150 may be photolithography.

Figure 2C:
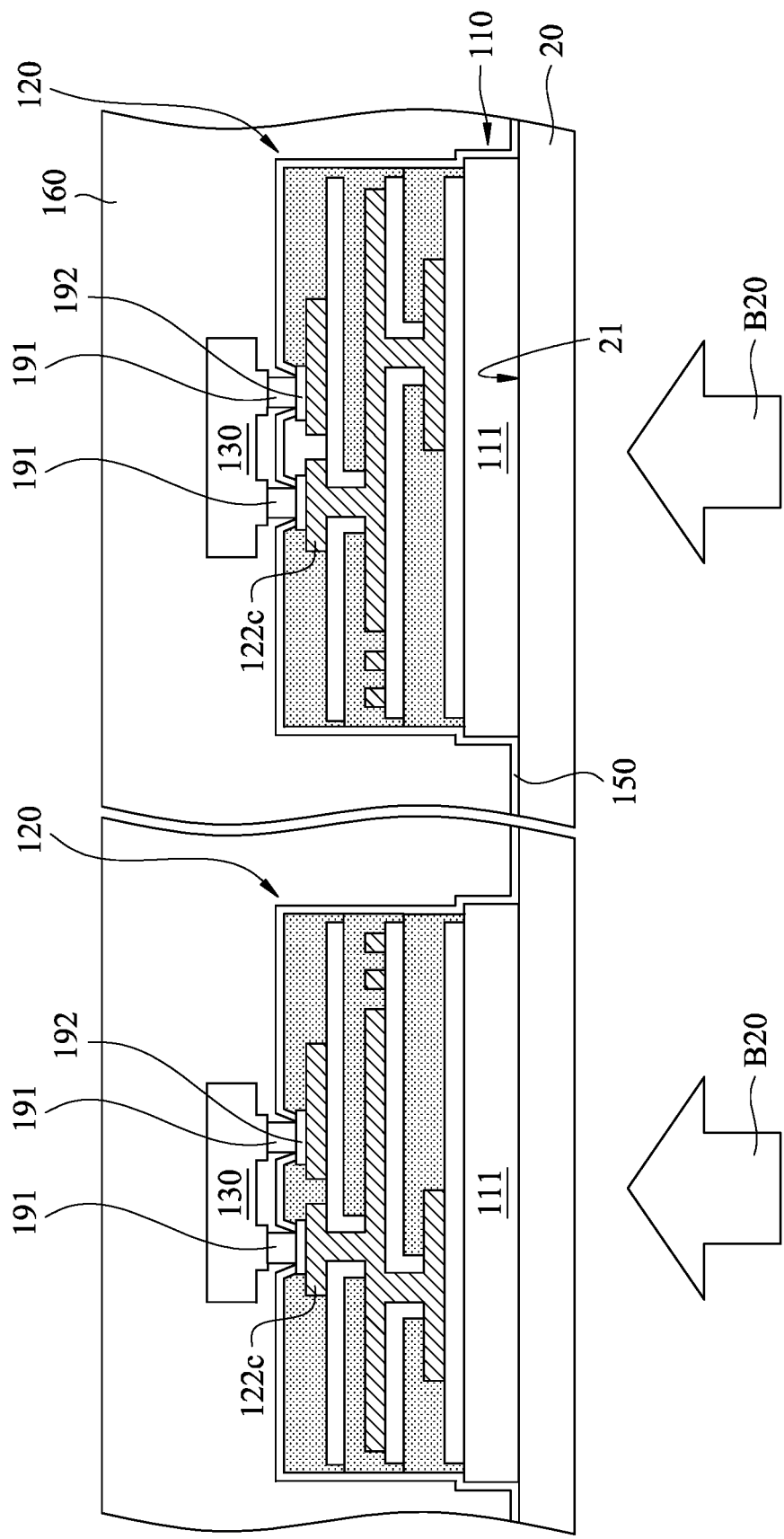

Referring to FIG. 2C, then, the light-emitting components 130 are disposed on the circuit structures 120, where the light-emitting components 130 may be mounted on the connecting layers 192 by utilizing the conductive members 191, and may be electrically connected to the conductive pattern layer 122c through the conductive members 191 and the connecting layers 192. Then, the stretchable filling material 160 is formed on the substrate 110 and the supporting plate 20, and the stretchable filling material 160 may completely cover the substrate 110, the laser absorbing layer 150, the light-emitting components 130 and the circuit structures 120.

Figure 2D:
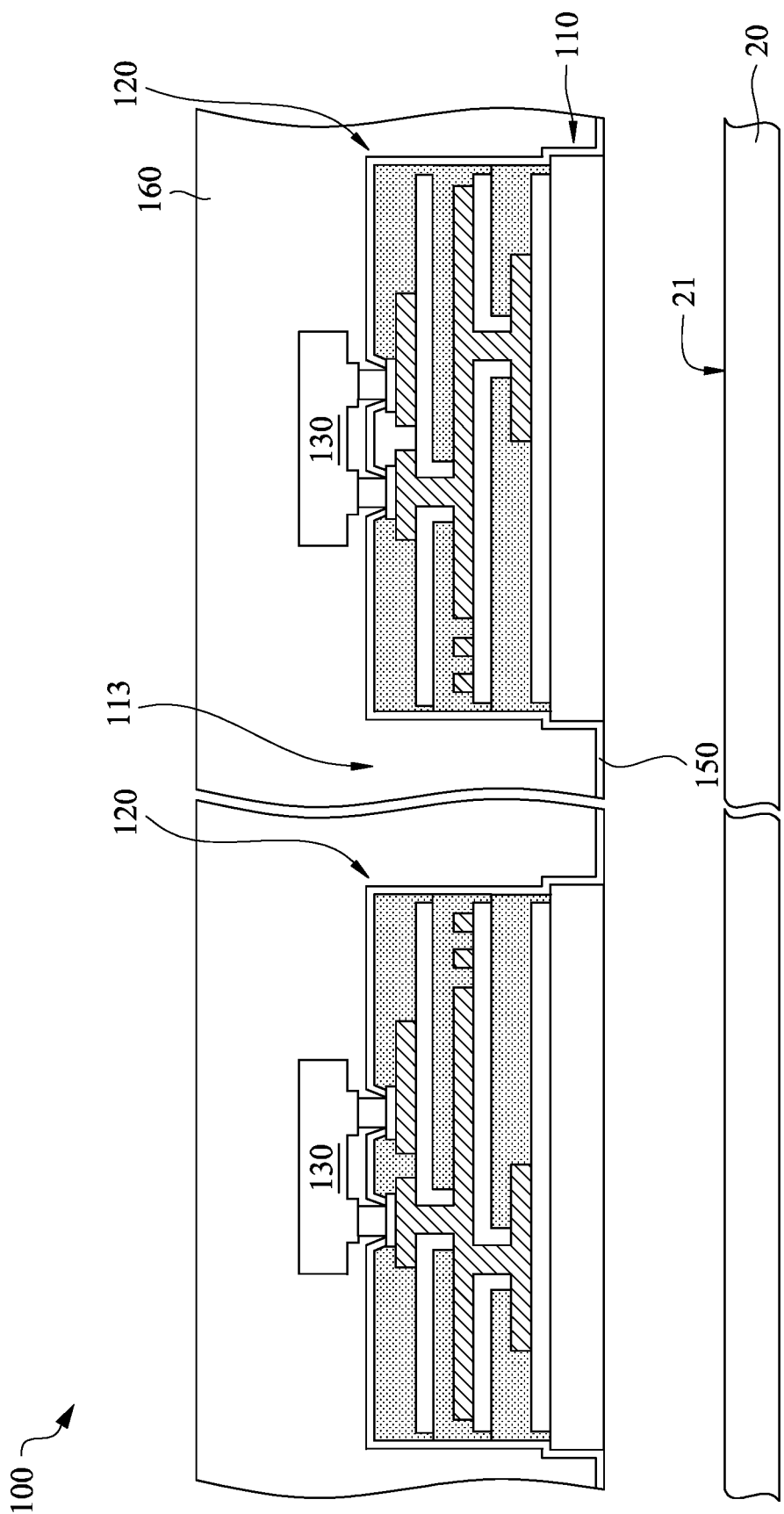

Referring to FIG. 2C and FIG. 2D, after forming the stretchable filling material 160, laser liftoff is performed to detach the supporting plate 20 and the substrate 110. Specifically, a laser beam B20 is emitted to the substrate 110 and the laser absorbing layer 150 from the supporting plate 20, that is, the laser beam B20 is incident to a lower surface of the supporting plate 20, such that the laser beam B20 passes through the supporting plate 20 and is incident to the substrate 20 and the laser absorbing layer 150. The wavelength of the laser beam B20 may be less than or equal to 400 nm, such as 308 nm or 355 nm, so the laser beam B20 may be a visible light (for example, 400 nm) or ultraviolet light.

Since the supporting plate 20 is a transparent rigid substrate (such as a glass plate), when the laser beam B20 is the visible light, the laser beam B20 basically may fully pass through the supporting plate 20 to be incident to the substrate 110 and the laser absorbing layer 150. When the laser beam B20 is the ultraviolet light, the supporting plate 20 may be a rigid substrate that the ultraviolet light mostly may pass therethrough, and may be a glass plate. Alternatively, the supporting plate 20 may be an opaque rigid substrate but the ultraviolet light mostly may pass therethrough. Thus, viewing from human eyes, the supporting plate 20 may be a transparent or opaque substrate.

A transmittance of the substrate 110 and the laser absorbing layer 150 for light with a wavelength less than or equal to 400 nm is less than or equal to 10%, that is, between 0-10%, so the substrate 110 and the laser absorbing layer 150 may absorb most of the laser beam B20, where the color of the laser absorbing layer 150 may be black to help the laser absorbing layer 150 to absorb more of the laser beam B20. Thus, the laser beam B20 may heat the substrate 110 and the laser absorbing layer 150 to gasify or ablate a portion of the substrate 110 and a portion of the laser absorbing layer 150 in contact with the supporting plate 20, thereby detaching the supporting plate 20 and the substrate 110. Thus, manufacturing of the stretchable display panel 100 is basically complete.

The transmittance of the substrate 110 and the laser absorbing layer 150 for light with the wavelength less than or equal to 400 nm is less than or equal to 10%, and the upper surface 21 of the supporting plate 20 is completely covered by the laser absorbing layer 150 and the substrate 110. That is, the supporting plate 20 is only in contact with the laser absorbing layer 150 and the substrate 110, but is not in contact with the stretchable filling material 160. Thus, after performing the laser liftoff, the portion of the substrate 110 and the portion of the laser absorbing layer 150 in contact with the supporting plate 20 may be gasified or ablated, such that the substrate 110, the laser absorbing layer 150 and the stretchable filling material 160 is not adhered to the supporting plate 20. Thus, even through the absorption of the stretchable filling material 160 to the laser beam B20 is relatively low, the supporting plate 20 and the substrate 110 may be detached smoothly, such that the stretchable display panel 100 is not damaged due to being pulled, thereby enhance the yield of the stretchable display panel 100.

Further, since the color of the laser absorbing layer 150 may be black, the laser absorbing layer 150 may shield the circuit structures 120 to avoid the conductive pattern layers 122a, 122b and 122c in the circuit structures 120 from affecting the image quality. For example, the black laser absorbing layer 150 may reduce the reflection of the conductive pattern layers 122a, 122b and 122c for outer light, thus reducing the ill effect to the image by the outer light.

It should be noted that, in the present embodiment, the laser absorbing layer 150 completely covers the substrate 110, the circuit structures 120 and the supporting plate 20. However, in other embodiments, the laser absorbing layer 150 may cover only the upper surface 21 of the supporting plate 20 located in the openings 113, without covering any of the circuit structures 120, such that the upper surface 21 may be completely covered by the laser absorbing layer 150 and the substrate 110. That is, the supporting plate 20 is only in contact with the laser absorbing layer 150 and the substrate 110, but is not in contact with the stretchable filling material 160.

Thus, although the laser absorbing layer 150 covers only the upper surface 21 of the supporting plate 20 located in the openings 113, without covering any of the circuit structures 120, after performing the laser liftoff, the substrate 110, the laser absorbing layer 150 and the stretchable filling material 160 do not adhere to the supporting plate 20, such that the supporting plate 20 and the substrate 110 may detach smoothly. Thus, in the stretchable display panel 100 according to other embodiments, the laser absorbing layer 150 may be disposed only in the openings 113, without covering or being in contact with any of the circuit structure 120.

Figure 3:
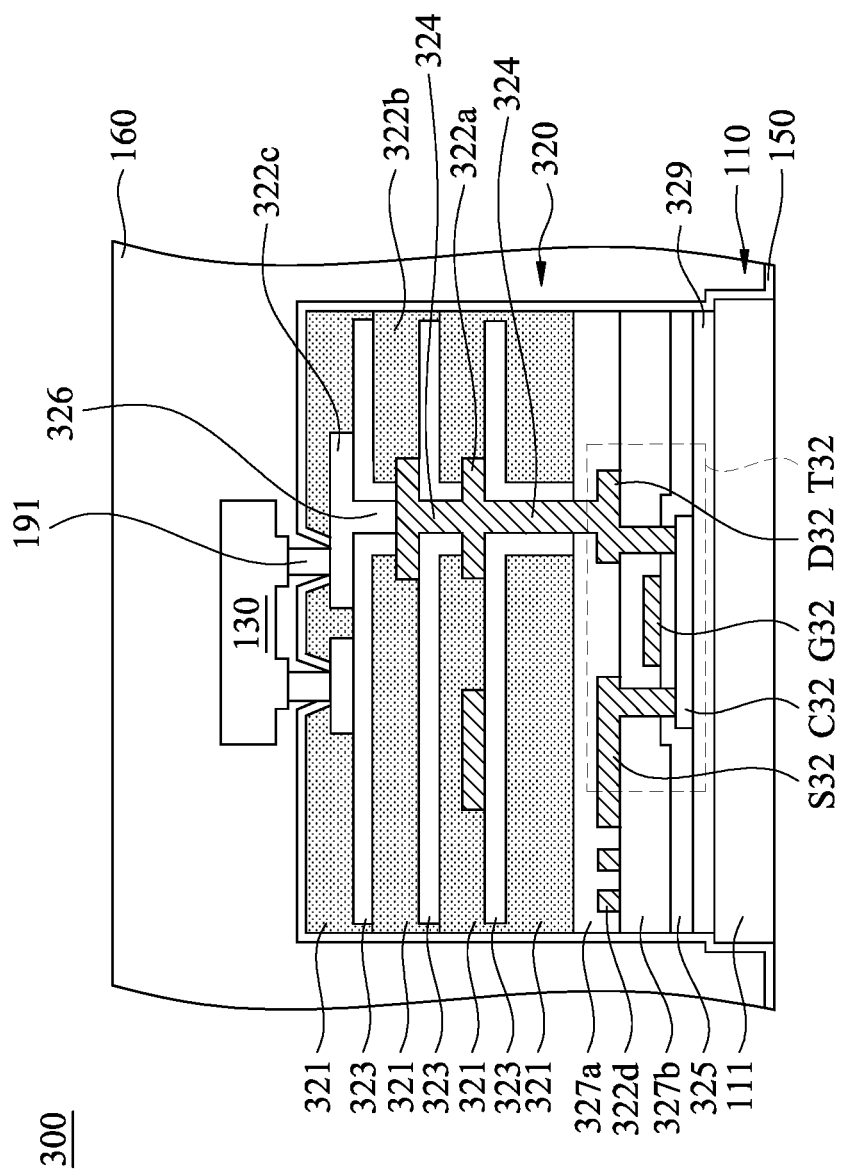
FIG. 3 is a sectional schematic view of a stretchable display panel according to another embodiment of the present disclosure.

FIG. 3 is a sectional schematic view of a stretchable display panel according to another embodiment of the present disclosure. Referring to FIG. 3, the stretchable display panel 300 in the present embodiment is similar to the stretchable display panel 100 in the aforementioned embodiment. For example, the stretchable display panels 300 and 100 include identical components, such as the substrate 110, the light-emitting components 130 (FIG. 3 showing only one thereof), the stretchable filling material 160 and the conductive members 191.

Secondly, the top view structure of the stretchable display panel 300 is substantially identical to the top view structure of the stretchable display panel 100, as shown in FIG. 1A. Thus, the circuit structures 320 (FIG. 3 showing only one thereof) included by the stretchable display panel 300 are also disposed on the island sections 111 of the substrate 110, where FIG. 3 illustrates the sectional schematic view of the circuit structure 320 on one of the island sections 111. The differences between the stretchable display panels 300 and 100 are hereinafter described, and the identical features between the stretchable display panels 300 and 100 are not further elaborated and not illustrated in the drawings.

Different from the stretchable display panel 100, the stretchable display panel 300 is an active display panel, where the circuit structures 320 included by the stretchable display panel 300 are different from the aforementioned circuit structures 120. Specifically, each circuit structure 320 includes a plurality of transistor components T32 (FIG. 3 showing only one thereof), and the transistor components T32 are electrically connected to the light-emitting components 130 to control the light-emitting components 130 to emit light.

Each transistor component T32 may be a thin film transistor (TFT), and also be a field-effect transistor (FET). Thus, each transistor component T32 may include a gate G32, a source S32, a drain D32 and a channel layer C32. The source S32 and the drain D32 are connected to the channel layer C32, and the gate G32 is located on the source S32 and the drain D32, where the gate G32 is not directly electrically connected to the source S32 and the drain D32, so the gate G32 is not in contact with the source S32 and the drain D32.

The gate G32 overlaps with the channel layer C32, and the gate G32 and the channel layer C32 are separated from each other. In details, each circuit structure 320 may further include a gate insulating layer 325, which is located between the gate G32 and the substrate 110, where the gate insulating layer 325 covers the substrate 110 and the channel layer C32, such that the gate G32 and the channel layer C32 are separated from each other. Thus, the gate G32, the gate insulating layer 325 and the channel layer C32 forms a capacitor component, and the electric filed generated by the gate G32 may control the carrier distribution in the channel layer C32 to turn on or turn off the transistor component T32.

In the same transistor component T32, the drain D32 is electrically connected to the light-emitting component 130, and the gate G32 and the source S32 are respectively electrically connected to two different signal lines. For example, the stretchable display panel 300 may further include a plurality of signal lines (not illustrated in FIG. 3), and the signal lines are respectively located in the bridge sections 112 of the substrate 110 (referring to FIG. 1A), and may respectively extend along the first direction D1 and the second direction D2, similar to the signal lines 141 and 142 as shown in FIG. 1A.

The signal line extending along the second direction D2 (similar to the signal lines 141 in FIG. 1A) may be electrically connected to the source S32, and the signal line extending along the first direction D1 (similar to the signal lines 142 in FIG. 1A) may be electrically connected to the gate G32. Thus, the signal lines extending along the first direction D1 may turn on and turn off the transistor components T32 to control the other signal lines (extending along the second direction D2) to input pixel signals to the light-emitting components 130 through the transistor components T32, thereby controlling the light-emitting components 130 to emit light, such that the stretchable display panel 300 may display image.

The circuit structure 320 may further include a plurality of insulating layers 321, 323, 327a and 327b stacked with each other, a plurality of conductive pattern layers 322a, 322b, 322c and 322d, and a plurality of conductive connecting portions 324 and 326. The insulating layers 321 and 323 are both disposed on the insulating layer 327a, and the insulating layer 327a is located between the insulating layer 327b and the lowermost insulating layer 321. Further, the insulating layers 321 may be organic material layers, and the insulating layers 323, 327a and 327b may be inorganic material layers, which may be formed by, for example, silicon oxide or silicon nitride.

Each insulating layer 323 is adjacent to at least one layer of the insulating layers 321, and the insulating layers 321 and 323 are stacked alternately, where each of the conductive pattern layers 322a, 322b and 322c is sandwiched between adjacent insulating layers 321 and 323, and the conductive pattern layer 322d, a portion of the drain D32 and a portion of the source S32 are sandwiched between the insulating layers 327a and 327b. Further, another portion of the drain D32 and another portion of the source S32 both pass the insulating layer 327b to be connected to the channel layer C32.

The conductive pattern layer 322b is located between the conductive pattern layers 322a and 322c, and the conductive connecting portions 324 and 326 are located in the insulating layers 321 and 323, where the conductive connecting portions 324 are electrically connected to the conductive pattern layers 322a, 322b and the drain D32, and the conductive connecting portions 326 are electrically connected to the conductive pattern layer 322c. Thus, the conductive pattern layers 322a, 322b and 322c and the drain D32 in the same circuit structure 320 may be electrically connected through the conductive connecting portions 324 and 326.

Further, the conductive pattern layer 322c and the conductive connecting portions 326 being connected together may be integrally formed, and the conductive pattern layer 322c and the conductive connecting portions 326 may be formed by metal or metal oxide, where the metal oxide may be, for example, indium tin oxide (ITO). The conductive members 191 pass through the laser absorbing layer 150 and the insulating layers 321 to be connected to the conductive pattern layer 322c, such that the light-emitting components 130 may be electrically connected to the conductive pattern layer 322c through the conductive members 191. Through the conductive connecting portions 324 and 326, the light-emitting components 130 may be electrically connected to the transistor components T32, such that the transistor components T32 may control the light-emitting components 130 to emit light, thereby forming the display image.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A stretchable display panel, comprising:
    a substrate, having a plurality of island sections and a plurality of bridge sections, wherein the island sections are connected to the bridge sections, and the island sections and the bridge sections define a plurality of openings of the substrate;
    a plurality of circuit structures, disposed on the island sections;
    a plurality of light-emitting components, disposed on the circuit structures;
    a plurality of signal lines, disposed on the bridge sections, wherein the signal lines are electrically connected to the circuit structures;
    a laser absorbing layer, disposed in at least the openings, wherein the laser absorbing layer is further disposed on the circuit structures and on the signal lines and covers a side wall of each of the circuit structures and the signal lines; and
    a stretchable filling material, disposed above the substrate, wherein the stretchable filling material covers at least the laser absorbing layer and the light-emitting components;
    wherein the island sections, the bridge sections and the openings are arranged on a plane, and each of the openings are surrounded by at least two of the island sections and at least two of the bridge sections.

2. The stretchable display panel according to claim 1, wherein each of the circuit structures comprises:
    a plurality of insulating layers stacked with each other;
    a plurality of conductive pattern layers, electrically connected to the light-emitting components and the signal lines, wherein each of the conductive pattern layers is located between two adjacent ones of the insulating layers; and
    a plurality of conductive connecting portions, located in the insulating layers, and connected between two adjacent ones of the conductive pattern layers.

3. The stretchable display panel according to claim 2, wherein the conductive pattern layers are not coplanar to one another.

4. The stretchable display panel according to claim 3, wherein one of the conductive pattern layers and the signal lines connected thereto are formed by a same metal layer.

5. The stretchable display panel according to claim 4, wherein the one of the conductive pattern layers and the signal lines connected thereto are integrally formed.

6. The stretchable display panel according to claim 1, wherein the circuit structures comprise:
    a plurality of transistor components, electrically connected to the light-emitting components.

7. The stretchable display panel according to claim 1, further comprising:
    a plurality of conductive members, disposed between the light-emitting components and the circuit structures, and electrically connected to the light-emitting components and the circuit structures.

8. The stretchable display panel according to claim 7, wherein a material of at least one of the conductive members is indium (In).

9. The stretchable display panel according to claim 1, wherein a transmittance of the laser absorbing layer for light with a wavelength less than or equal to 400 nm is less than or equal to 10%.

10. The stretchable display panel according to claim 1, wherein a color of the laser absorbing layer is black.

11. The stretchable display panel according to claim 1, wherein the laser absorbing layer is an organic insulating layer or an inorganic insulating layer.

12. The stretchable display panel according to claim 1, wherein the laser absorbing layer comprises at least one of an amorphous silicon layer, a silicon oxide layer and a silicon nitride layer.

13. The stretchable display panel according to claim 1, wherein when the stretchable display panel is not stretched and not bent, widths at two ends of at least one of the openings is greater than a width at a middle portion of the at least one of the openings.

14. The stretchable display panel according to claim 1, wherein each of the circuit structures has two or more of the light-emitting components disposed thereon.

15. The stretchable display panel according to claim 14, wherein the two or more of the light-emitting components disposed on each of the circuit structures emit light with different colors.

* * * * *